United States Patent
Feng et al.

(10) Patent No.: US 9,530,505 B1
(45) Date of Patent: Dec. 27, 2016

(54) EEPROM MEMORY CELL GATE CONTROL SIGNAL GENERATING CIRCUIT

(71) Applicant: SHANGHAI HUAHONG GRACE SEMICONDUCTOR MANUFACTURING CORPORATION, Shanghai (CN)

(72) Inventors: Guoyou Feng, Shanghai (CN); Yanli Zhao, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 14/976,710

(22) Filed: Dec. 21, 2015

(30) Foreign Application Priority Data

Jun. 10, 2015 (CN) .......................... 2015 1 0315395

(51) Int. Cl.
| | | |
|---|---|---|
| G11C 16/08 | (2006.01) |
| G11C 16/10 | (2006.01) |
| G11C 16/24 | (2006.01) |
| G11C 16/12 | (2006.01) |
| G11C 16/14 | (2006.01) |
| G11C 16/26 | (2006.01) |
| G11C 16/16 | (2006.01) |
| G11C 5/06 | (2006.01) |
| G11C 16/30 | (2006.01) |

(52) U.S. Cl.
CPC ............... *G11C 16/08* (2013.01); *G11C 16/14* (2013.01); *G11C 5/06* (2013.01); *G11C 16/10* (2013.01); *G11C 16/12* (2013.01); *G11C 16/16* (2013.01); *G11C 16/24* (2013.01); *G11C 16/26* (2013.01); *G11C 16/30* (2013.01)

(58) Field of Classification Search
CPC ......... G11C 16/08; G11C 16/26; G11C 16/10; G11C 16/14; G11C 5/06
USPC ................................ 365/185.05, 185.23, 72
See application file for complete search history.

(56) References Cited

U.S. PATENT DOCUMENTS

| 5,351,217 A * | 9/1994 | Jeon ......................... G11C 8/08 326/106 |
| 2011/0205815 A1* | 8/2011 | Murata .................. G11C 16/08 365/189.11 |

* cited by examiner

*Primary Examiner* — Ly D Pham
(74) *Attorney, Agent, or Firm* — MKG, LLC

(57) ABSTRACT

An EEPROM memory cell gate control signal generating circuit, which includes a high-voltage row decoding circuit and a plurality of word selection circuits; the output of the high-voltage row decoding circuit is divided into two routes, which output a first total wordline voltage used for providing the erasing positive voltage and a second total wordline voltage used for providing the erasing negative voltage, respectively; besides, the two-route voltages are inputted into the individual word selection circuits respectively, which avoids the influence of the erasing positive voltage on the grid oxide layer of an NMOS transistor and the influence of the erasing negative voltage on a PMOS transistor, and can save the MOS transistor used for isolating the grid oxide layer.

10 Claims, 2 Drawing Sheets

EEPROM MEMORY CELL GATE CONTROL SIGNAL GENERATING CIRCUIT

FIELD OF THE INVENTION

The present invention relates to a semiconductor integrated circuit, particularly to an EEPROM memory cell gate control signal generating circuit.

BACKGROUND

The EEPROM (Electrically Erasable Programmable Read-Only Memory) structure based on the SONOS (Silicon-Oxide-Nitride-Oxide-Silicon) transistor has the following requirements as shown in Table 1 for the gate voltage of the memory cell, i.e., the wordline voltage WLS, and for the substrate VBULK of the memory cell:

TABLE 1

| | | Unselected word | | |
|---|---|---|---|---|
| | Selected word | In the same column but different row | In the same row but different column | In the different row and different column |
| WLS | | | | |
| Erasing | VNEG | VPOS | VSS | VSS |
| Programming | VPOS | VNEG | VSS | VSS |
| VBULK | | | | |
| Erasing | VPOS | VPOS | VSS | VSS |
| Programming | VNEG | VNEG | VSS | VSS |

Wherein VPOS is the erasing positive voltage, a positive high voltage required for erasing and programming, and VNEG is the erasing negative voltage, a negative high voltage required for erasing and programming. While programming, the gate and the substrate of the selected memory cell are applied with VPOS and VNEG, respectively, and carry out the programming operation; both the gate and the substrate of the unselected memory cell in the same column with the selected memory cell are applied with VNEG, and the programming operation will not be carried out. While erasing, the gate and the substrate of the selected memory cell are applied with VNEG and VPOS, respectively, the erasing operation will be carried out; both the gate and the substrate of the unselected memory cell in the same column with the selected memory cell are applied with VPOS, the programming operation will not be carried out. VSS represents ground.

As shown in FIG. 1, an existing EEPROM memory cell gate control signal generating circuit comprises: its generating circuit is divided into two parts: a high-voltage row decoding circuit 101 and a plurality of word selection circuits, such as a word selection circuit 1 and a word selection circuit n, which are marked with 1021 and 102n, respectively, wherein 102i represents any word selection circuit i, with i being any digit from 1 to n.

The total wordline voltage GWLS is generated by the high-voltage row decoding circuit 101. The total wordline voltage GWLS needs the two values, VNEG and VPOS, wherein VPOS is generated by the PMOS transistors P0 and P1 under the control of the control signals X2SP, S2SPB, OE_SP and VDP, and VNEG is generated by the NMOS transistors N0 and N1 under the control of the control signals X2SN, S2SNB, OE_SN and VDN. However, the drains of the PMOS transistors P0 and P1 cannot be connected directly to the drains of the NMOS transistors N0 and N1; otherwise, when the drains of the PMOS transistors P0 and P1 output VPOS, VNEG will appear at the gates of the NMOS transistors N0 and N1, which will make the voltage of the gate oxide layer of the NMOS transistors N0 and N1 too high; when the drains of the NMOS transistors N0 and N1 output VNEG, VPOS will appear at the gates of the PMOS transistors P0 or P1, which will make the voltage of the gate oxide layer of the PMOS transistors P0 or P1 too high. Therefore, a PMOS transistor P2 and an NMOS transistor N2 need to be added to the existing technology to realize isolation, wherein the gate of the PMOS transistor P2 is connected to the ground VSS, and the gate of the NMOS transistor N2 is connected to the working voltage VDD, which make the voltage of the gate oxide layer of the PMOS transistors P0 and P1 and the NMOS transistors N0 and N1 reduced, thus protecting the gate oxide layer.

The word selection circuit is the same in structure. Taking i of any digit from 1 to n as an example, the word selection circuit i includes the PMOS transistor 4i, and the NMOS transistors N4i, N6i and N5i, with the individual grids connected to the control signals BSPBi, BSNi, VDD and BDN, respectively; the word selection circuit i outputs the wordline voltage WSLi, which selects an output from the total wordline voltage GWLS and VSS, with the total wordline voltage GWLS including the two voltages, VPOS and VNEG. Likewise, the PMOS transistor P3i is used for protection of the gate oxide layer of the PMOS transistor P4i, and the NMOS transistor N3i is used for protection of the gate oxide layer of the NMOS transistor N4i, the gate of the PMOS transistor P3i being connected to the ground VSS, the gate of the NMOS transistor N4i being connected to the working voltage VDD.

SUMMARY

A technical problem to be solved by the present invention is to provide an EEPROM memory cell gate control signal generating circuit, which can simplify the circuit and reduce cost.

In order to solve the above technical problem, the EEPROM memory cell gate control signal generating circuit provided by the present invention comprises: a high-voltage row decoding circuit and a plurality of word selection circuits.

The high-voltage row decoding circuit comprises a first-part row decoding circuit composed of a first PMOS transistor and a second PMOS transistor, and a second-part row decoding circuit composed of a first NMOS transistor and a second NMOS transistor.

The drain of the first PMOS transistor is connected to the drain of the second PMOS transistor to output a first total wordline voltage the gate of the first PMOS transistor is connected to a first control signal, the gate of the second PMOS transistor is connected to a second control signal, the source of the first PMOS transistor is connected to a third control signal, and the source of the second PMOS transistor is connected to a fourth control signal; the first total wordline voltage outputted by the first-part row decoding circuit is made to be either the erasing positive voltage or levitation under the control of the first control signal, the second control signal, the third control signal and the fourth control signal.

The drain of the first NMOS transistor is connected to the drain of the second NMOS transistor to output a second total wordline voltage, the gate of the first NMOS transistor is connected to a fifth control signal, the gate of the second NMOS transistor is connected to a sixth control signal, the source of the first NMOS transistor is connected to a seventh control signal, and the source of the second NMOS transistor is connected to an eighth control signal; the second total wordline voltage outputted by the second-part row decoding circuit is made to be either the erasing negative voltage or levitation under the control of the fifth control signal, the sixth control signal, the seventh control signal and the eighth control signal; the second total wordline voltage being levitated when the first total wordline voltage is the erasing positive voltage, the first total wordline voltage being levitated when the second total wordline voltage is the erasing negative voltage.

A wordline of each memory cell of EEPROM is connected to one of the word selection circuits, which are the same in structure. Each of the word selection circuits including a third PMOS transistor, a third NMOS transistor, a fourth NMOS transistor and a fifth NMOS transistor.

The drain of the third PMOS transistor, the drain of the third NMOS transistor and the drain of the fourth NMOS transistor are connected together to output a wordline voltage, which is inputted into a wordline of the corresponding memory cell.

The source of the third PMOS transistor is connected to the first total wordline voltage, the source of the third NMOS transistor is connected to the second total wordline voltage, the source of the fourth NMOS transistor is connected to the drain of the fifth NMOS transistor, and the source of the fifth NMOS transistor is grounded.

The gate of the third PMOS transistor is connected to a ninth control signal, the gate of the third NMOS transistor is connected to a tenth control signal, the gate of the fourth NMOS transistor is connected to the working voltage, and the gate of the fifth NMOS transistor is connected to an eleventh control signal; the wordline voltage is made to output one of the erasing negative voltage, erasing positive voltage and ground under the control of the ninth control signal, the tenth control signal and the eleventh control signal.

As a further improvement, the first control signal, the second control signal, the third control signal and the fourth control signal are all switched between ground and the erasing positive voltage.

As a further improvement, the first control signal and the second control signal are just mutually inverting in logic.

As a further improvement, the fifth control signal, the sixth control signal, the seventh control signal and the eighth control signal are all switched between the working voltage and the erasing negative voltage.

As a further improvement, the fifth control signal and the sixth control signal are just mutually inverting in logic.

As a further improvement, the ninth control signal is switched between ground and the erasing positive voltage, the tenth control signal is switched between the working voltage and the erasing negative voltage, and the eleventh control signal is switched between the working voltage and the erasing negative voltage.

As a further improvement, when one of the memory cells of EEPROM is selected, the ninth control signal of the word selection circuit to which this memory cell corresponds is grounded, the tenth control signal is connected to the working voltage, the eleventh control signal is connected to the erasing negative voltage, and the wordline voltage is one of the erasing negative voltage and the erasing positive voltage.

As a further improvement, when one of the memory cells of EEPROM is not selected, the ninth control signal of the word selection circuit to which this memory cell corresponds is connected to the erasing positive voltage, the tenth control signal is connected to the erasing negative voltage, the eleventh control signal is connected to the working voltage, and the wordline voltage is ground.

As a further improvement, the erasing positive voltage is used during programming for being applied to the gate of the selected memory cell and programming this selected memory cell, and also used during erasing for being applied to the gate of the unselected memory cell in the same column with the selected memory cell and preventing the unselected memory cell in the same column with the selected memory cell from being erased; the erasing negative voltage is used during erasing for being applied to the gate of the selected memory cell and erasing the selected memory cell, and also used during programming for being applied to the gate of the unselected memory cell in the same column with the selected memory cell and preventing the unselected memory cell in the same column with the selected memory cell from being programmed.

As a further improvement, the memory cell of EEPROM is an SONOS transistor.

The present invention, by which the total wordline voltage of the high-voltage row decoding circuit are outputted into two routes which are the erasing positive voltage transferred by PMOS and the erasing negative voltage transferred by NMOS, can thus eliminate the influence of the positive high voltage on the gate oxide layer of the negative high-voltage output terminal, and the influence of the negative high voltage on the gate oxide layer of the positive high-voltage output terminal, and therefore two MOS transistors used for isolating the gate oxide layer in the high-voltage row decoding circuit are saved; besides, the two routes of the total wordline voltage outputted by the high-voltage row decoding circuit of the present invention are inputted into the individual word selection circuits, which can likewise save two MOS transistors used for isolating the gate oxide layer in each of the word selection circuits, and therefore the present invention can simplify the circuit and reduce the cost.

BRIEF DESCRIPTION OF THE DRAWINGS

The present invention will be further described below in detail with reference to drawings and specific embodiments.

DETAILED DESCRIPTION

Figure 2:
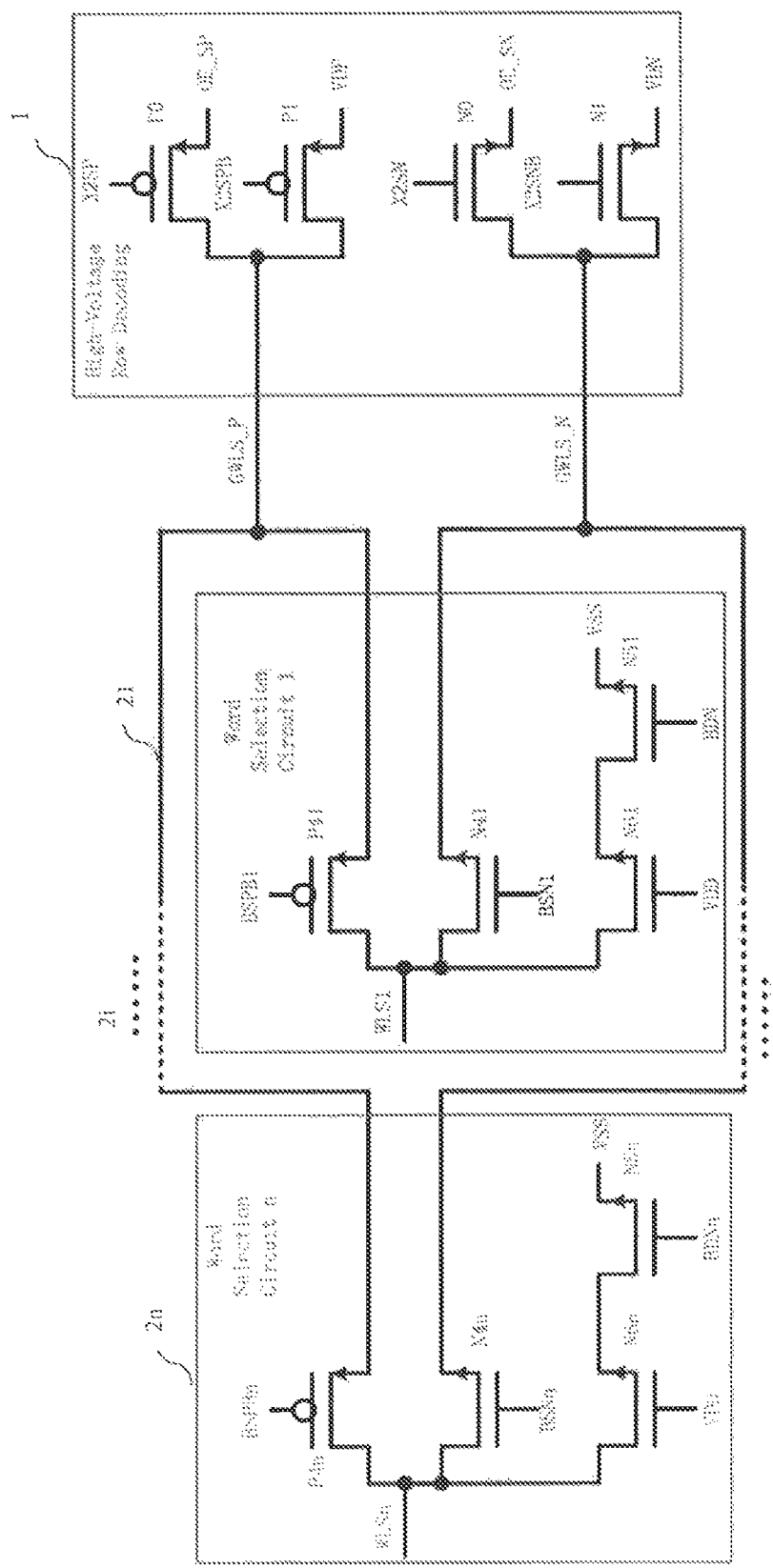
FIG. 2 is a diagram of the EEPROM memory cell gate control signal generating circuit of the example of the present invention.

As shown in FIG. 2, it is a diagram of the EEPROM memory cell gate control signal generating circuit of the example of the present invention. The EEPROM memory cell gate control signal generating circuit of the example of the present invention includes: a high-voltage row decoding circuit 1 and a plurality of word selection circuits; for example, the word selection circuit 1 to n are marked with 21 to 2n, respectively, wherein 2i marks the word selection circuit, with i being any digit from 1 to n.

The high-voltage row decoding circuit 1 includes a first-part row decoding circuit composed of a first PMOS transistor P0 and a second PMOS transistor P1, and a second-part row decoding circuit composed of a first NMOS transistor N0 and a second NMOS transistor N1.

The drain of the first PMOS transistor P0 is connected to the drain of the second PMOS transistor P1 to output a first total wordline voltage GWLS_P, the gate of the first PMOS transistor P0 is connected to a first control signal X2SP, the gate of the second PMOS transistor P1 is connected to a second control signal X2SPB, the source of the first PMOS transistor P0 is connected to a third control signal OE-SP and the source of the second PMOS transistor P1 is connected to a fourth control signal VDP the first total wordline voltage GWLS_P outputted by the first-part row decoding circuit is made to be one of the erasing positive voltage, i.e. VPOS, and levitation under the control of the first control signal X2SP, the second control signal X2SPB, the third control signal OE-SP and the fourth control signal VDP.

The drain of the first NMOS transistor N0 is connected to the drain of the second NMOS transistor N1 to output a second total wordline voltage GWLS_N, the gate of the first NMOS transistor N0 is connected to a fifth control signal X2SN, the gate of the second NMOS transistor N1 is connected to a sixth control signal X2SNB, the source of the first NMOS transistor N0 is connected to a seventh control signal OE_SN, and the source of the second NMOS transistor N1 is connected to an eighth control signal VDN; the second total wordline voltage GWLS_N outputted by the second-part row decoding circuit is made to be one of the erasing negative voltage, i.e. VNEG, and levitation under the control of the fifth control signal X2SN, the sixth control signal X2SNB, the seventh control signal OE_SN and the eighth control signal VDN; the second total wordline voltage GWLS_N is levitated when the first total wordline voltage GWLS_P is the erasing positive voltage, the first total wordline voltage GWLS_P is levitated when the second total wordline voltage GWLS_N is the erasing negative voltage.

A wordline of each memory cell of EEPROM is connected to one of the word selection circuits, which are the same in structure; taking the word selection circuit i marked with 2*i* as an example, each of the word selection circuits includes a third PMOS transistor P4*i*, a third NMOS transistor N4*i*, a fourth NMOS transistor N6*i* and a fifth NMOS transistor N5*i*.

The drain of the third PMOS transistor P4*i*, the drain of the third NMOS transistor N4*i* and the drain of the fourth NMOS transistor N6*i* are connected together to output the wordline voltage WLSi, which is inputted into a wordline of the corresponding memory cell.

The source of the third PMOS transistor P4*i* is connected to the first total wordline voltage GWLS_P, the source of the third NMOS transistor N4*i* is connected to the second total wordline voltage GWLS_N, the source of the fourth NMOS transistor N6*i* is connected to the drain of the fifth NMOS transistor N5*i*, and the source of the fifth NMOS transistor N5*i* is connected to the ground VSS.

The gate of the third PMOS transistor P4*i* is connected to a ninth control signal BSPBi, the gate of the third NMOS transistor N4*i* is connected to a tenth control signal BSNi, the gate of the fourth NMOS transistor N6*i* is connected to the working voltage VDD, and the gate of the fifth NMOS transistor N5*i* is connected to an eleventh control signal BDN; the wordline voltage WLSi is made to output one of the erasing negative voltage, erasing positive voltage and ground VSS under the control of the ninth control signal BSPBi, the tenth control signal BSNi and the eleventh control signal BDN.

Preferably, the first control signal X2SP, the second control signal X2SPB, the third control signal OE_SP and the fourth control signal VDP are all switched between the ground VSS and the erasing positive voltage. The first control signal X2SP and the second control signal X2SPB are just mutually inverting.

The fifth control signal X2SN, the sixth control signal X2SNB, the seventh control signal OE_SN and the eighth control signal VDN are all switched between the working voltage VDD and the erasing negative voltage. The fifth control signal X2SP and the sixth control signal X2SPB are just mutually inverting.

The ninth control signal BSPBi is switched between the ground VSS and the erasing positive voltage, the tenth control signal BSNi is switched between the working voltage VDD and the erasing negative voltage, and the eleventh control signal BDN is switched between the working voltage VDD and the erasing negative voltage.

When one of the memory cells of EEPROM is selected, the ninth control signal BSPBi of the word selection circuit to which this memory cell corresponds is connected to the ground VSS, the tenth control signal BSNi is connected to the working voltage VDD, the eleventh control signal BDN is connected to the erasing negative voltage, and the wordline voltage WLSi is either the erasing negative voltage or the erasing positive voltage.

When one of the memory cells of EEPROM is not selected, the ninth control signal BSPBi of the word selection circuit to which this memory cell corresponds is connected to the erasing positive voltage, the tenth control signal BSNi is connected to the erasing negative voltage, the eleventh control signal BDN is connected to the working voltage VDD, and the wordline voltage WLSi is the ground VSS.

The erasing positive voltage, i.e. VPOS, is used during programming for being applied to the gate of the selected memory cell and programming this selected memory cell, and also used during erasing for being applied to the gate of the unselected memory cell in the same column with the selected memory cell and preventing the unselected memory cell in the same column with the selected memory cell from being erased; the erasing negative voltage, i.e. VNEG, is used during erasing for being applied to the gate of the selected memory cell and erasing the selected memory cell, and also used during programming for being applied to the gate of the unselected memory cell in the same column with the selected memory cell and preventing the unselected memory cell in the same column with the selected memory cell from being programmed. The erasing positive voltage is greater than the working voltage VDD.

In a preferred example, the individual control signals of the high-voltage row decoding circuit 1 can take the values shown in Table 2:

TABLE 2

|  | X2SP | X2SPB | X2SN | X2SNB | OE_SP | OE_SN | VDP | VDN | GWLS_P | GWLS_N |
|---|---|---|---|---|---|---|---|---|---|---|
| Erasing | VSS | VPOS | VDD | VNEG | VSS | VNEG | VPOS | VDD | Levitation | VNEG |
|  | VSS | VPOS | VDD | VNEG | VPOS | VDD | VPOS | VDD | VPOS | Levitation |
|  | VPOS | VSS | VNEG | VDD | VPOS | VDD | VPOS | VDD | VPOS | Levitation |

TABLE 2-continued

|  | X2SP | X2SPB | X2SN | X2SNB | OE_SP | OE_SN | VDP | VDN | GWLS_P | GWLS_N |
|---|---|---|---|---|---|---|---|---|---|---|
|  | VPOS | VSS | VNEG | VDD | VSS | VNEG | VPOS | VDD | VPOS | Levitation |
| Programming | VSS | VPOS | VDD | VNEG | VPOS | VDD | VSS | VNEG | VPOS | Levitation |
|  | VSS | VPOS | VDD | VNEG | VSS | VNEG | VSS | VNEG | Levitation | VNEG |
|  | VPOS | VSS | VNEG | VDD | VSS | VNEG | VSS | VNEG | Levitation | VNEG |
|  | VPOS | VSS | VNEG | VDD | VPOS | VDD | VSS | VNEG | Levitation | VNEG |

In a preferred example, the individual control signals of the individual word selection circuits can take the values shown in Table 3:

TABLE 3

|  | BSPB | BSN | BDN | WLS |
|---|---|---|---|---|
| A word selection circuit in the same column with the selected word | VSS | VDD | VNEG | VPOS or VNEG |
| A word selection circuit in a column not the same with the selected word | VPOS | VNEG | VDD | VSS |

The memory cell of EEPROM in the example of the present invention is an SONOS transistor.

Figure 1:
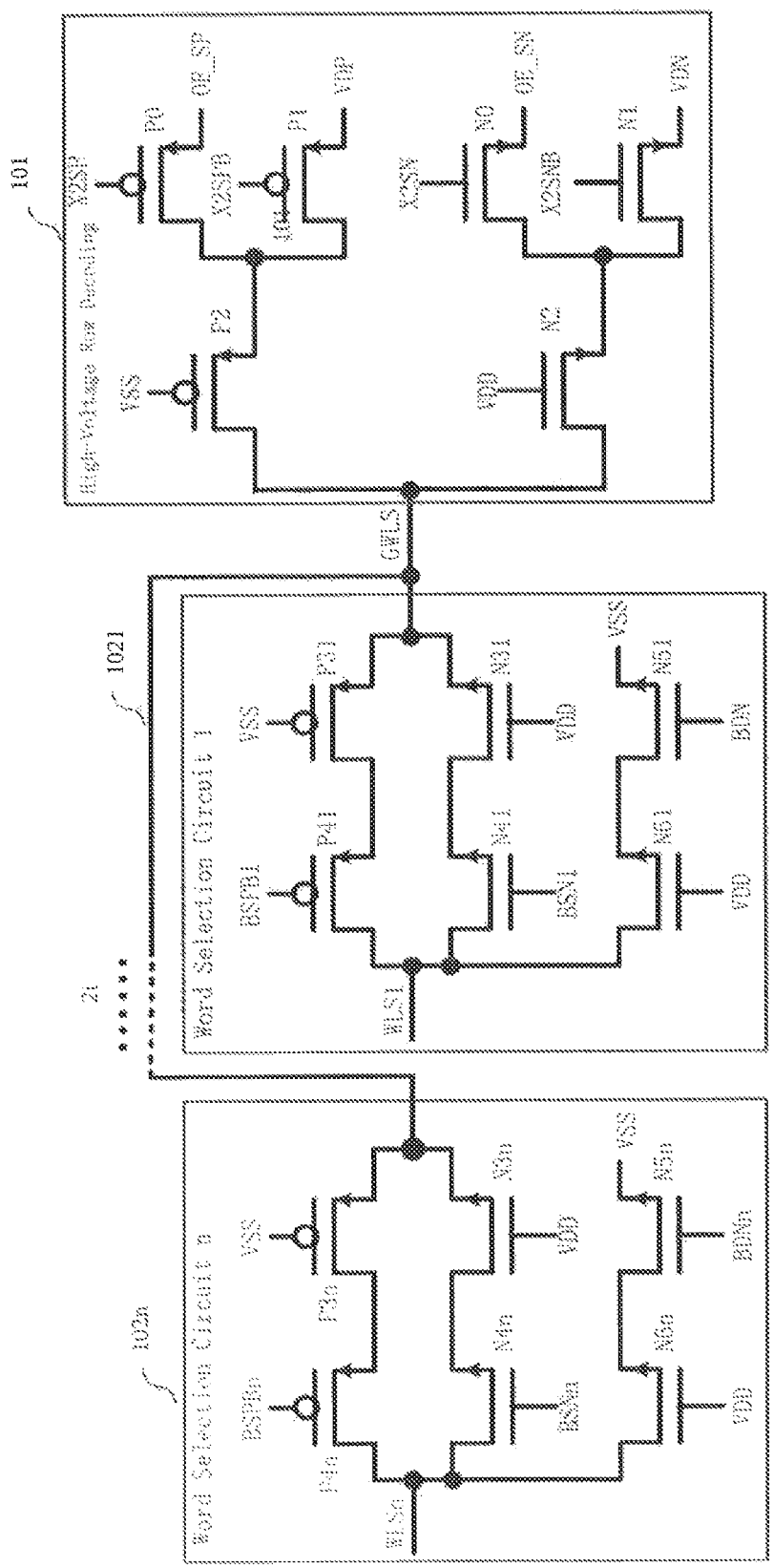
FIG. 1 is a diagram of an existing EEPROM memory cell gate control signal generating circuit.

It can be known from FIG. 2 that, the present invention connects the first total wordline voltage GWLS_P and the second total wordline voltage GWLS_N separately; because the first total wordline voltage GWLS_P is used for outputting VPOS, VPOS will not influence the gate oxide layer of the first NMOS transistor N0, the second NMOS transistor N1 and the third NMOS transistor N4$i$; likewise, because the second total wordline voltage GWLS_N is used for outputting VNEG, VNEG will not influence the gate oxide layer of the first PMOS transistor P0, the second PMOS transistor P1 and the third PMOS transistor P4$i$; therefore, compared with the existing circuit in FIG. 1, the example of the present invention can save the MOS transistor used for isolating the gate oxide layer, thus simplifying the circuit and reducing the cost.

The present invention is described above in detail through specific examples, which, however, do not restrict the present invention. Without departing from the principle of the present invention, those skilled in the art may also make many variations and improvements, which should also be considered to be within the scope of protection of the present invention.

What is claimed is:

1. An EEPROM memory cell gate control signal generating circuit, comprising:

a high-voltage row decoding circuit and a plurality of word selection circuits;

the high-voltage row decoding circuit comprises a first-part row decoding circuit composed of a first PMOS transistor and a second PMOS transistor, and a second-part row decoding circuit composed of a first NMOS transistor and a second NMOS transistor;

the drain of the first PMOS transistor is connected to the drain of the second PMOS transistor to output a first total wordline voltage, the gate of the first PMOS transistor is connected to a first control signal, the gate of the second PMOS transistor is connected to a second control signal, the source of the first PMOS transistor is connected to a third control signal, and the source of the second PMOS transistor is connected to a fourth control signal; the first total wordline voltage outputted by the first-part row decoding circuit is made to be one of an erasing positive voltage and levitation under the control of the first control signal, the second control signal, the third control signal and the fourth control signal;

the drain of the first NMOS transistor is connected to the drain of the second NMOS transistor to output a second total wordline voltage, the gate of the first NMOS transistor is connected to a fifth control signal, the gate of the second NMOS transistor is connected to a sixth control signal, the source of the first NMOS transistor is connected to a seventh control signal, and the source of the second NMOS transistor is connected to an eighth control signal; the second total wordline voltage outputted by the second-part row decoding circuit is made to be one of an erasing negative voltage and levitation under the control of the fifth control signal, the sixth control signal, the seventh control signal and the eighth control signal; the second total wordline voltage being levitated when the first total wordline voltage is the erasing positive voltage, the first total wordline voltage being levitated when the second total wordline voltage is the erasing negative voltage;

a wordline of each memory cell of EEPROM is connected to one of the word selection circuits, which are the same in structure, with each of the word selection circuits including a third PMOS transistor, a third NMOS transistor, a fourth NMOS transistor and a fifth NMOS transistor;

the drain of the third PMOS transistor, the drain of the third NMOS transistor and the drain of the fourth NMOS transistor are connected together to output a wordline voltage, which is inputted into a wordline of the corresponding memory cell;

the source of the third PMOS transistor is connected to the first total wordline voltage, the source of the third NMOS transistor is connected to the second total wordline voltage, the source of the fourth NMOS transistor is connected to the drain of the fifth NMOS transistor, and the source of the fifth NMOS transistor is grounded; and the gate of the third PMOS transistor is connected to a ninth control signal, the gate of the third NMOS transistor is connected to a tenth control signal, the gate of the fourth NMOS transistor is connected to a working voltage, and the gate of the fifth NMOS transistor is connected to an eleventh control signal; the wordline voltage is made to output one of the erasing negative voltage, erasing positive voltage and ground under the control of the ninth control signal, the tenth control signal and the eleventh control signal.

2. The EEPROM memory cell gate control signal generating circuit according to claim 1, wherein the first control signal, the second control signal, the third control signal and the fourth control signal are all switched between ground and the erasing positive voltage.

3. The EEPROM memory cell gate control signal generating circuit according to claim 2, wherein the first control signal and the second control signal are just mutually inverting in logic.

4. The EEPROM memory cell gate control signal generating circuit according to claim 1, wherein the fifth control signal, the sixth control signal, the seventh control signal and the eighth control signal are all switched between the working voltage and the erasing negative voltage.

5. The EEPROM memory cell gate control signal generating circuit according to claim 4, wherein the fifth control signal and the sixth control signal are just mutually inverting in logic.

6. The EEPROM memory cell gate control signal generating circuit according to claim 1, wherein the ninth control signal is switched between ground and the erasing positive voltage, the tenth control signal is switched between the working voltage and the erasing negative voltage, and the eleventh control signal is switched between the working voltage and the erasing negative voltage.

7. The EEPROM memory cell gate control signal generating circuit according to claim 6, wherein when one of the memory cells of EEPROM is selected, the ninth control signal of the word selection circuit to which this memory cell corresponds is grounded, the tenth control signal is connected to the working voltage, the eleventh control signal is connected to the erasing negative voltage, and the wordline voltage is one of the erasing negative voltage and the erasing positive voltage.

8. The EEPROM memory cell gate control signal generating circuit according to claim 6, wherein when one of the memory cells of EEPROM is not selected, the ninth control signal of the word selection circuit to which this memory cell corresponds is connected to the erasing positive voltage, the tenth control signal is connected to the erasing negative voltage, the eleventh control signal is connected to the working voltage, and the wordline voltage is ground.

9. The EEPROM memory cell gate control signal generating circuit according to claim 1, wherein the erasing positive voltage is used during programming for being applied to the gate of the selected memory cell and programming this selected memory cell, and also used during erasing for being applied to the gate of the unselected memory cell in the same column with the selected memory cell and preventing the unselected memory cell in the same column with the selected memory cell from being erased; the erasing negative voltage is used during erasing for being applied to the gate of the selected memory cell and erasing the selected memory cell, and also used during programming for being applied to the gate of the unselected memory cell in the same column with the selected memory cell and preventing the unselected memory cell in the same column with the selected memory cell from being programmed.

10. The EEPROM memory cell gate control signal generating circuit according to claim 9, wherein the memory cell of EEPROM is an SONOS transistor.

* * * * *